United States Patent [19]

Sonnenberger

[11] Patent Number: 4,689,655
[45] Date of Patent: Aug. 25, 1987

[54] SEMICONDUCTOR DEVICE HAVING A BIPOLAR TRANSISTOR WITH EMITTER SERIES RESISTANCES

[75] Inventor: Paul Sonnenberger, Hamburg, Fed. Rep. of Germany

[73] Assignee: U.S. Philips Corporation, New York, N.Y.

[21] Appl. No.: 878,524

[22] Filed: Jun. 24, 1986

Related U.S. Application Data

[63] Continuation of Ser. No. 750,236, Jun. 28, 1985, abandoned, which is a continuation of Ser. No. 618,308, Jun. 7, 1984, abandoned, which is a continuation of Ser. No. 260,664, May 4, 1981, abandoned.

[30] Foreign Application Priority Data

May 9, 1980 [DE] Fed. Rep. of Germany ....... 3017750

[51] Int. Cl.$^4$ ............. H01L 29/72; H01L 29/10; H01L 27/02; H01L 23/48
[52] U.S. Cl. ........................ 357/45; 357/34; 357/36; 357/51; 357/68
[58] Field of Search ............ 357/34, 36, 45, 51, 357/65, 68

[56] References Cited

U.S. PATENT DOCUMENTS

| | | | |
|---|---|---|---|
| 3,358,197 | 12/1967 | Scarlett | 357/36 |
| 3,609,460 | 9/1971 | Ollendorf | 357/68 |
| 3,704,398 | 11/1972 | Fukino | 357/36 |
| 3,740,621 | 6/1973 | Carley | 357/36 X |
| 4,205,332 | 5/1980 | Conti et al. | 357/340 R |
| 4,231,059 | 10/1980 | Hower et al. | 357/68 |
| 4,266,236 | 5/1981 | Ueda | 357/340 R |
| 4,370,670 | 1/1983 | Nawata et al. | 357/360 R |

FOREIGN PATENT DOCUMENTS 2822166  11/1978  Fed. Rep. of Germany ........ 357/36

Primary Examiner—J. Carroll
Attorney, Agent, or Firm—Robert T. Mayer; Steven R. Biren

[57] ABSTRACT

An integrated circuit or other semiconductor device, comprises a semiconductor body with a bipolar transistor consisting of electrically parallel transistor structures at least a number of which have a different value of emitter series resistance. The transistor emitter zone comprises a number of active emitter regions which constitute the emitters of the different transistor structures, a number of emitter contact regions contacted by emitter metallization via emitter contact windows, and a number of emitter connection regions which interconnect the emitter contact regions and the active emitter regions. The different values of emitter series resistance of the transistor structures are realized by having a different size or location with respect to the emitter connection regions for at least a number of the emitter contact windows, without necessitating a variation of the emitter zone geometry for each transistor structure. Preferably the emitter connection region are bounded by parts of the base zone which are situated within the emitter zone and between the emitter and base contact windows.

5 Claims, 4 Drawing Figures

SEMICONDUCTOR DEVICE HAVING A BIPOLAR TRANSISTOR WITH EMITTER SERIES RESISTANCES

This is a continuation of application Ser. No. 750,236, filed June 28, 1985, which was a continuation of Ser. No. 618,308, filed June 7, 1984, which was a continuation of Ser. No. 260,664, filed May 4, 1981, all now abandoned.

BACKGROUND OF THE INVENTION

The invention relates to a semiconductor device, comprising a semiconductor body with a bipolar transistor which consists of electrically parallel transistor structures at least a number of which have different values of emitter series resistance, said transistor comprising a collector zone which is formed by a semiconductor region of a first conductivity type, a base zone of the second, opposite conductivity type which adjoins both the collector zone and a surface of the semiconductor body, base metallization contacting the base zone via a number of base contact windows in an insulating layer at said surface, and an emitter zone of the first conductivity type which is formed in the base zone and which comprises a number of active emitter regions which are situated near the base contact windows and which constitute the emitters of the transistor structures, said emitter zone further comprising a number of emitter contact regions contacted by an emitter metallization via emitter contact windows in the insulating layer, and a number of emitter connection regions which interconnect the emitter contact regions and the active emitter regions.

A semiconductor device having these features is particularly suitable for use in integrated circuits. By a suitable proportioning of the emitter series resistances in accordance with the circuit, a uniform temperature distribution can be obtained during operation in the part of the semiconductor body which is occupied by the transistor. The power handling capability of the bipolar transistor, limited by local overheating, can thus be improved.

A semiconductor device having these features is described in W. German Patent Application DE-OS 2625989, corresponding to U.S. Pat. No. 4,072,979, in which the various emitter series resistances of the sub-transistors are obtained by imparting different dimensions to the emitter connection regions of the transistor structures.

It is a drawback of this known semiconductor device that, in order to realize a desirable distribution of the emitter series resistance values across the surface occupied by the bipolar transistor, a particular emitter zone configuration is required, that is to say an emitter diffusion mask which has been constructed in a given manner. Because the dissipation of heat of the transistor in an integrated circuit is dependent on its position within the integrated circuit, different emitter diffusion masks may be required in order to include the transistor in different integrated circuits.

SUMMARY OF THE INVENTION

It is an object of the invention to provide a semiconductor device where this drawback is mitigated. To this end, a semiconductor device having the features specified above is characterized according to the invention in that different values of emitter resistance of the transistor structures are obtained by having a different size or location with respect to the emitter connection regions for at least a number of the emitter contact windows.

A desirable distribution of the emitter series resistance values across the area occupied by the bipolar transistor can then be realized by appropriately choosing the sizes of the emitter contact windows. In order to include the transistor in different integrated circuits, therefore, it is merely necessary to design different masks for the contact windows in the insulating layer on the surface of the semiconductor body and for the various metallizations, the basic lay-out of the transistor remaining unchanged. This renders a semiconductor device in accordance with the invention particularly suitable for use in cases where integrated circuits are assembled from previously-designed elements and where previously-designed semiconductor structures are adjacently arranged in a semiconductor body; only a special design of the contact metallization and associated contact windows is then necessary.

BRIEF DESCRIPTION OF THE DRAWING

An embodiment of the invention will be described in detail hereinafter, by way of example, with reference to the accompanying drawings, in which.

Figure 1:
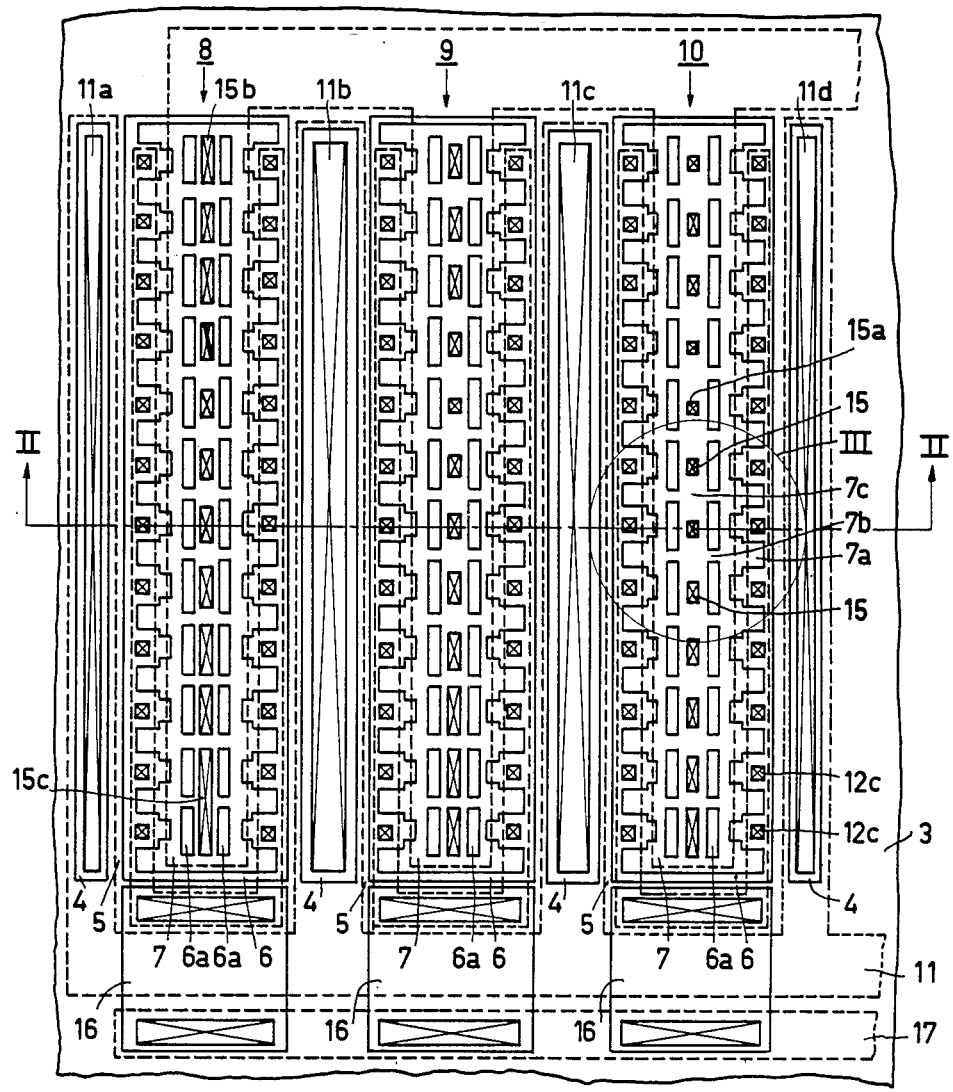
FIG. 1 is a plan view of a semiconductor device in accordance with the invention.

The Figures are diagrammatic and not to scale, and in particular dimensions in the thickness direction are exaggerated in the cross-sectional views for the sake of clarity. Semiconductor zones of the same conductivity type are shaded in the same direction; corresponding parts in the Figures are denoted by corresponding reference numerals.

DESCRIPTION OF THE PREFERRED EMBODIMENT

Figure 2:
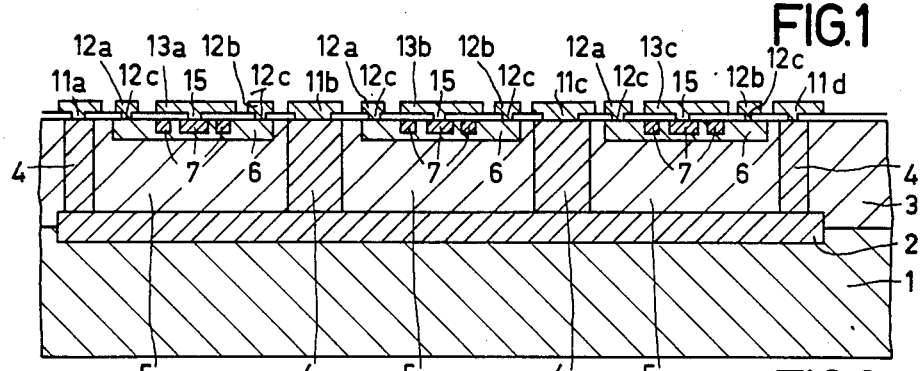
FIG. 2 is a cross-sectional view of the semiconductor device taken along the line II—II in FIG. 1.
Figure 3:
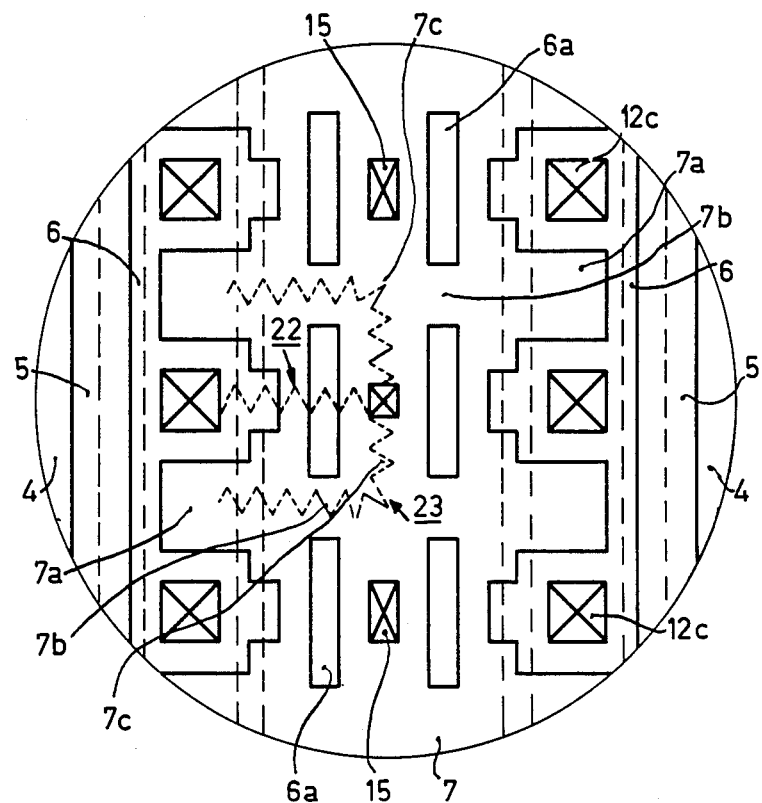
FIG. 3 is an enlarged plan view of the part of FIG. 1 which is enclosed by the circle III.

The semiconductor device of FIGS. 1 to 3 comprises a semiconductor body with a p-type substrate 1 on which an n-type epitaxial layer 3 has been grown, an n-type buried layer 2 having been formed in known manner between the substrate 1 and the layer 3.

N-type contact zones 4 which extend into the buried layer 2 define three elongate finger-shaped collector zones 5 in the epitaxial layer 3, said collector zones being contacted via the contact zones 4.

Furthermore, in each of the collector zones 5 there is formed a p-type base zone 6, while in each of the base zones 6 there is formed an n-type emitter zone 7. As shown in the plan view of FIGS. 1 and 3, the emitter zone is such that each emitter finger 8, 9 and 10 comprises a series of corresponding structures each of which forms a subtransistor. In each of these (sub)transistor structures the emitter zone comprises an active emitter region 7a, a connection region 7b, and an emitter contact region 7c. On the surface of the semiconductor device the separate zones are contacted via associated conductor tracks. The three collector zones 5 and the four collector contact zones 4 are connected, via four collector contact windows 11a to 11d, to a collector metallization 11. Three base zones 6 are connected, via base contact windows 12c, to a base metallization 12 which is split into two paths 12a and 12b for each emitter finger 8, 9, 10. The paths 12a and 12b of the base metallization 12 are electrically connected to a base electrode 17 in a customary manner via p-type zones 16 formed in the epitaxial layer 3. Finally, the emitter zones 7 are connected, via emitter contact windows 15, to an emitter metallization which is also split into three paths 13a, 13b and 13c, that is to say one path for each emitter finger 8, 9, 10.

The emitter connection zones 7b are bounded by parts 6a of the base zone 6 which are situated within the emitter zone 7 and which adjoin the surface between the emitter contact windows 15 and the base contact windows 12c, said parts 6a preferably being at least approximately the same for all transistor structures in the emitter fingers 8, 9 and 10. Thus, a simple transistor lay-out is obtained in which the emitter series resistances can be accurately adjusted as will be described hereinafter.

Each transistor structure of each emitter finger is contacted by these emitter contact paths, that is to say via a contact window 15, whose size defines the emitter series resistance for that transistor structure. If a very small contact window is chosen, for example, like the contact window 15a in the right emitter finger 10, its extent and location with respect to the emitter connection regions 7b are such that a comparatively high emitter series resistance and hence a small emitter current is obtained for the associated transistor structure. However, if a comparatively large contact window such as 15b in the left emitter finger 8 is chosen, its extent and location with respect to the emitter connection regions 7b are such that the emitter series resistance of the transistor structure will be low and a larger emitter current will flow in this transistor structure. The contact window 15c in the left emitter finger 8 may even be chosen to be so large that it extends across two transistor structures, which means that an emitter series resistance as low as possible is obtained for these transistor structures.

Thus a given emitter series resistance and hence a current distribution can be chosen for each transistor structure merely by laying down the size of the emitter contact windows 15, it being possible to utilize the heat dissipation resulting from the position of the transistor within an integrated circuit so that a uniform temperature distribution across the surface occupied by the transistor is obtained. In the device of FIGS. 1 to 3, the emitter contact windows 15 near the periphery of the area occupied by the bipolar transistor are larger than those situated in the center of said area. Furthermore, in choosing the location, extent and size of the contact windows 15 (and hence the emitter series resistances), the voltage drop in the emitter metallization 13 can be taken into account. Thus, the size of the emitter contact windows 15 may be chosen to compensate at least partially for the voltage drop in the emitter metallization 13 during operation of the transistor. When the semiconductor body comprises other heat-developing elements in addition to the bipolar transistor, the emitter contact windows 15 which are situated near these other heat-developing elements may be made smaller than the emitter contact windows 15 which are situated further from these elements. Thus, in determining the size of the contact windows 15 and hence the emitter series resistances and the temperature distribution within the transistor, the temperature influences of structural elements which are situated adjacent the transistor in the semiconductor body can also be taken into account.

Figure 4:
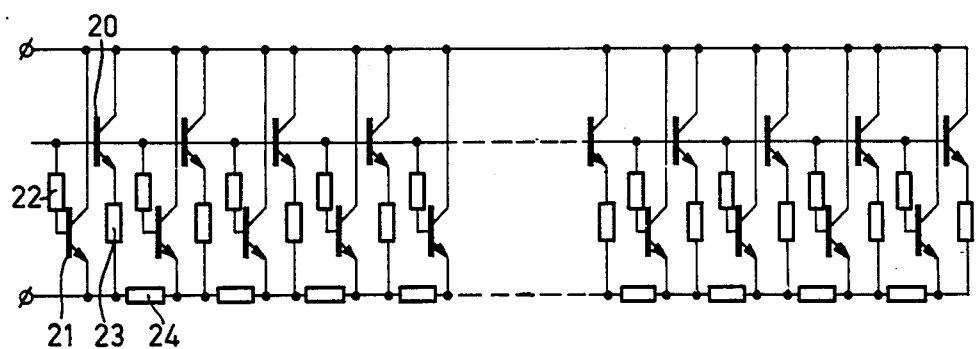
FIG. 4 shows a simplified equivalent diagram of a part of the semiconductor device shown in FIGS. 1 to 3.

FIG. 4 shows a simplified equivalent diagram of an emitter finger. Each of the transistor structures is represented by two transistors 20 and 21 in the equivalent diagram and the separate resistances are represented by three resistors 22, 23 and 24. The transistor 20 represents the part of the transistor which is formed by the active emitter region 7a, while the transistor 21 corresponds to that formed by the emitter contact region 7c. The resistor 22 is the resistance between the base contact window 12c and the emitter contact region 7c situated underneath the emitter contact window 15. The resistor 23 is the resistance of the emitter zone between the emitter contact window 15 and the active emitter region 7a and its value can be determined by the size of the emitter contact window 15 or by the location of the emitter contact window 15 with respect to the emitter connection region 7b. Two little emitter contact windows located at the ends of one large emitter contact window such as 15b would give the same emitter series resistances as that large emitter contact window. The resistor 24 is the resistance of the emitter metallization 13 between two successive emitter contact windows 15.

The resistors 22 are from approximately 500 to 1000 times larger than the resistors 23, so that the current flows mainly via the transistors 20 and the resistors 23. The current amplification of the transistors 20 and 21 is approximately 120.

It will be clear from the described embodiment that many modifications are possible within the scope of the invention. For example, in an embodiment in accordance with the invention, the conductivity type of all semiconductor zones and regions can be (simultaneously) replaced by the opposite type.

What is claimed is:

1. A semiconductor device, comprising a semiconductor body having a major surface with a bipolar transistor which comprises a plurality of surface-adjoining electrically parallel transistor structures, at least a number of which have different values of emitter series resistances, said transistor comprising a collector zone which is formed by a semiconductor region of a first conductivity type, a collector contact zone of said first conductivity type in contact with said collector zone and extending to said major surface, collector metallization contacting said collector contact zone at said major surface, a surface-adjoining base zone of the second, opposite conductivity type which adjoins the collector zone, base metallization contacting said base zone via a plurality of base contact windows in an insulating layer at said surface, and a surface-adjoining emitter zone of the first conductivity type which is formed in the base zone and which comprises a plurality of surface-adjoining active emitter regions of equal length which are situated near the base contact windows and which comprise the emitters of the transistor structures, said emitter zone further comprising a plurality of surface-adjoining emitter contact regions contacted by a substantially continuous emitter metallization via emitter contact windows in the insulating layer, and a plurality of emitter connection regions which interconnect the emitter contact regions and the active emitter regions, wherein said different values of emitter series resistance in the transistor structures are obtained by providing means for varying the lengths of said emitter connection regions, said means comprising emitter contact windows having different sizes, shapes and locations with respect to the emitter connection regions for at least some of the emitter contact windows.

2. A semiconductor device as claimed in claim 1, characterized in that the emitter contact windows near the periphery of the bipolar transistor are larger than those situated in the center of said area.

3. A semiconductor device as claimed in claim 1, characterized in that the semiconductor body comprises other heat-developing elements in addition to the bipolar transistor, and in that the emitter contact windows which are situated near said heat-developing elements are smaller than the emitter contact windows which are situated further from said elements.

4. A semiconductor device as claimed in claim 1, 2 or 3, characterized in that the size of the emitter contact windows is chosen to compensate at least partially for the voltage drop in the emitter metallization during operation of the transistor.

5. A semiconductor device as claimed in claim 1, 2 or 3, characterized in that the emitter connection regions are bounded by parts of the base zone situated within the emitter zone and which adjoin the surface between the emitter contact windows and the base contact windows.

* * * * *